(12) United States Patent
Cho (10) Patent No.: US 7,981,728 B2
(45) Date of Patent: Jul. 19, 2011

(54) CORELESS SUBSTRATE

(75) Inventor: Soon-Jin Cho, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/382,293

(22) Filed: Mar. 12, 2009

(65) Prior Publication Data

US 2009/0183909 A1   Jul. 23, 2009

Related U.S. Application Data

(62) Division of application No. 11/542,175, filed on Oct. 4, 2006, now Pat. No. 7,517,730.

(30) Foreign Application Priority Data

Oct. 14, 2005   (KR) ................. 10-2005-0096773

(51) Int. Cl.
    *H01L 21/00*   (2006.01)
(52) U.S. Cl. .................... 438/122; 174/262; 29/852
(58) Field of Classification Search .............. 438/122; 174/262; 29/852
    See application file for complete search history.

(56) References Cited

U.S. PATENT DOCUMENTS

| | | | |
|---|---|---|---|
| 6,404,049 B1 | 6/2002 | Shibamoto et al. | |
| 6,418,615 B1 * | 7/2002 | Rokugawa et al. | ............. 29/852 |
| 6,441,314 B2 | 8/2002 | Rokugawa et al. | |
| 6,451,448 B1 | 9/2002 | Kanda et al. | |
| 6,931,724 B2 * | 8/2005 | Rokugawa et al. | ............. 29/852 |
| 6,988,312 B2 * | 1/2006 | Nakamura et al. | ............. 29/830 |
| 7,164,198 B2 * | 1/2007 | Nakamura et al. | ............ 257/700 |
| 7,323,093 B2 | 1/2008 | Naito et al. | |
| 7,348,662 B2 | 3/2008 | Miyazaki et al. | |
| 7,353,591 B2 | 4/2008 | Yeh | |
| 7,517,730 B2 * | 4/2009 | Cho | ............... 438/122 |
| 7,600,315 B2 * | 10/2009 | Haze | ............... 29/846 |
| 7,605,459 B2 * | 10/2009 | Mok et al. | ...................... 257/686 |
| 7,640,655 B2 * | 1/2010 | Sunohara | .................... 29/832 |
| 7,648,096 B2 * | 1/2010 | Niitsuma et al. | .............. 242/289 |
| 2001/0013425 A1 | 8/2001 | Rokugawa et al. | |
| 2002/0195272 A1 | 12/2002 | Rokugawa et al. | |
| 2003/0166812 A1 | 9/2003 | Taniguchi et al. | |
| 2004/0046244 A1 * | 3/2004 | Nakamura et al. | ............ 257/700 |
| 2004/0074088 A1 * | 4/2004 | Nakamura et al. | .............. 29/831 |

(Continued)

FOREIGN PATENT DOCUMENTS

CN     1481658     3/2004

(Continued)

OTHER PUBLICATIONS

Office Action dated Jan. 21, 2008 and issued in corresponding Japanese Patent Application No. 2006-277249.

(Continued)

*Primary Examiner* — Laura M Menz (57) ABSTRACT

A coreless substrate having a plurality of function pads, etched from a metal sheet and having a protruded shape; an insulating layer, the insulating layer being formed on one side of the function pads, a circuit corresponding to a pattern being formed on the insulating layer, a via hole being formed on the insulating layer to electrically connect the function pads and the circuit; and a solder resist, being formed on the insulating layer to protect the surface of the insulating layer. The coreless substrate has a signal delivery characteristic that is improved by eliminating the inner via hole.

6 Claims, 5 Drawing Sheets

U.S. PATENT DOCUMENTS

| | | |
|---|---|---|
| 2005/0017271 A1 | 1/2005 | Rokugawa et al. |
| 2005/0067293 A1 | 3/2005 | Naito et al. |
| 2006/0076242 A1 | 4/2006 | Naito |
| 2007/0056766 A1* | 3/2007 | Sunohara ............... 174/260 |
| 2007/0084630 A1* | 4/2007 | Cho ........................ 174/262 |
| 2007/0096292 A1* | 5/2007 | Machida ................. 257/700 |
| 2007/0132536 A1 | 6/2007 | Lee et al. |
| 2007/0190237 A1 | 8/2007 | Kyozuka |
| 2007/0221400 A1* | 9/2007 | Kurashina et al. ...... 174/255 |
| 2007/0231962 A1* | 10/2007 | Fujii ...................... 438/107 |
| 2007/0278667 A1* | 12/2007 | Kusano et al. ......... 257/712 |
| 2007/0290310 A1* | 12/2007 | Kusano et al. ......... 257/684 |
| 2009/0100673 A1* | 4/2009 | Yukiiri et al. ............. 29/846 |
| 2009/0126981 A1* | 5/2009 | Horiuchi et al. ........ 174/262 |
| 2009/0126982 A1* | 5/2009 | Nakamura et al. ...... 174/262 |
| 2009/0135574 A1* | 5/2009 | Tanaka et al. .......... 361/803 |
| 2009/0141464 A1* | 6/2009 | Taguchi et al. ......... 361/760 |
| 2009/0145635 A1* | 6/2009 | Shimizu .................. 174/255 |
| 2009/0145636 A1* | 6/2009 | Miki et al. .............. 174/255 |
| 2009/0154128 A1* | 6/2009 | Tamadate ............... 361/783 |
| 2009/0166072 A1* | 7/2009 | Fuji et al. ............... 174/260 |
| 2009/0183909 A1* | 7/2009 | Cho ........................ 174/262 |
| 2009/0236130 A1* | 9/2009 | Mok et al. .............. 174/257 |
| 2010/0208437 A1* | 8/2010 | Maeda et al. ........... 361/760 |

FOREIGN PATENT DOCUMENTS

| | | |
|---|---|---|
| JP | 2004-47666 | 2/2004 |
| JP | 2004-47667 | 2/2004 |
| JP | 2005-236244 | 9/2005 |

OTHER PUBLICATIONS

Chinese Patent Office Action, mailed May 9, 2008 and issued in corresponding Chinese Patent Application No. 2006101400399.

Notice of Allowance dated Dec. 11, 2008 for related U.S. Appl. No. 11/542,175.

Office Action dated May 29, 2008 for related U.S. Appl. No. 11/542,175.

Restriction Requirement dated Feb. 11, 2008 for related U.S. Appl. No. 11/542,175.

* cited by examiner

CORELESS SUBSTRATE

CROSS-REFERENCE TO RELATED APPLICATIONS

This application is a U.S. divisional application filed under 35 USC 1.53(b) claiming priority benefit of U.S. Ser. No. 11/542,175 filed in the United States on Oct. 4, 2006, now U.S. Pat. No. 7,517,730 which claims earlier priority benefit to Korean Patent Application No. 10-2005-0096773 filed with the Korean Intellectual Property Office on Oct. 14, 2005, the disclosures of which are incorporated herein by reference.

BACKGROUND OF THE INVENTION

1. Field of the Invention

The present invention is directed to a substrate, more specifically to a coreless substrate and a manufacturing method thereof.

2. Description of the Related Art

As mobile phones, personal digital assistants (PDA), thin film transistor liquid crystal displays (TFT LCD) and many other electronic devices get smaller these days, the semiconductor devices that are installed in these devices are also getting smaller, thinner and lighter.

To keep up with this trend, flexible printed circuit boards (FPC), such as tape carrier packages (TCP) and chips on film (COF), in which a circuit pattern is formed on a base film, are used as a circuit board. Used for a semiconductor device package is the TAB (tape automated bonding) method, by which a pre-formed bump electrode and a circuit pattern, which is formed on a tape circuit board, are collectively bonded to a semiconductor device and the semiconductor device is mounted on the tape circuit board.

In the prior art, in order to reduce the warpage of a high-performance package substrate, a copper clad laminate core (epoxy-resin-impregnated glass fiber fabric, both sides of which are adhered with a copper foil) with a thickness of about 0.8 mm is used. In other words, the semiconductor package substrate of the prior art is a copper clad laminate on which a build-up layer is additionally formed.

Figure 1:
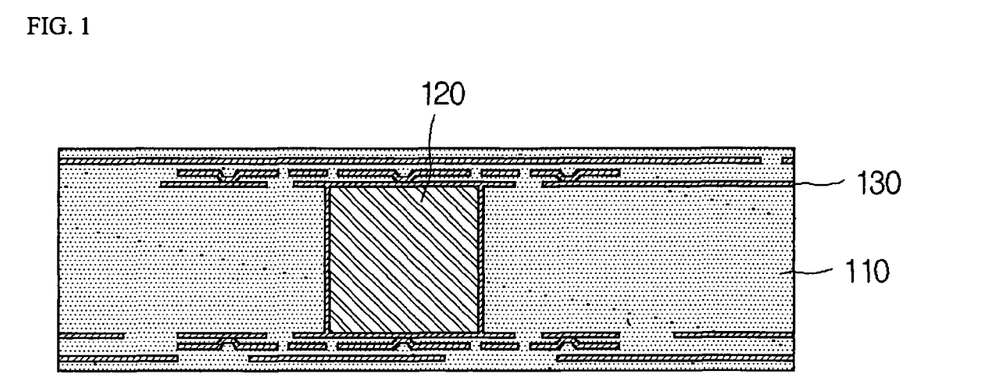
FIG. 1 shows a sectional view of a semiconductor package substrate with a thick core layer in accordance with the prior art.

FIG. 1 is the sectional view of a semiconductor package substrate with a thick core layer in accordance with the prior art. Referring to FIG. 1, the semiconductor package substrate of the prior art comprises a core layer 110 of the copper clad laminate (CCL), a circuit 130 and an interstitial via hole 120.

The core layer 110 of the CCL is generally about 400 μm~800 μm thick, and the insulating layer laminated on the core layer 110 of the CCL is about 30 μm~40 μm thick. Using a thick core layer 110 of the CCL may reduce the warpage problem but is hardly feasible for reducing the size of the inner via hole (IVH), which is imperative for making a high-performance package substrate. The diameter for the IVH, for electrical connection between the layers, is about 100 μm. This kind of IVH is usually formed by use of a CNC drill.

Figure 2:
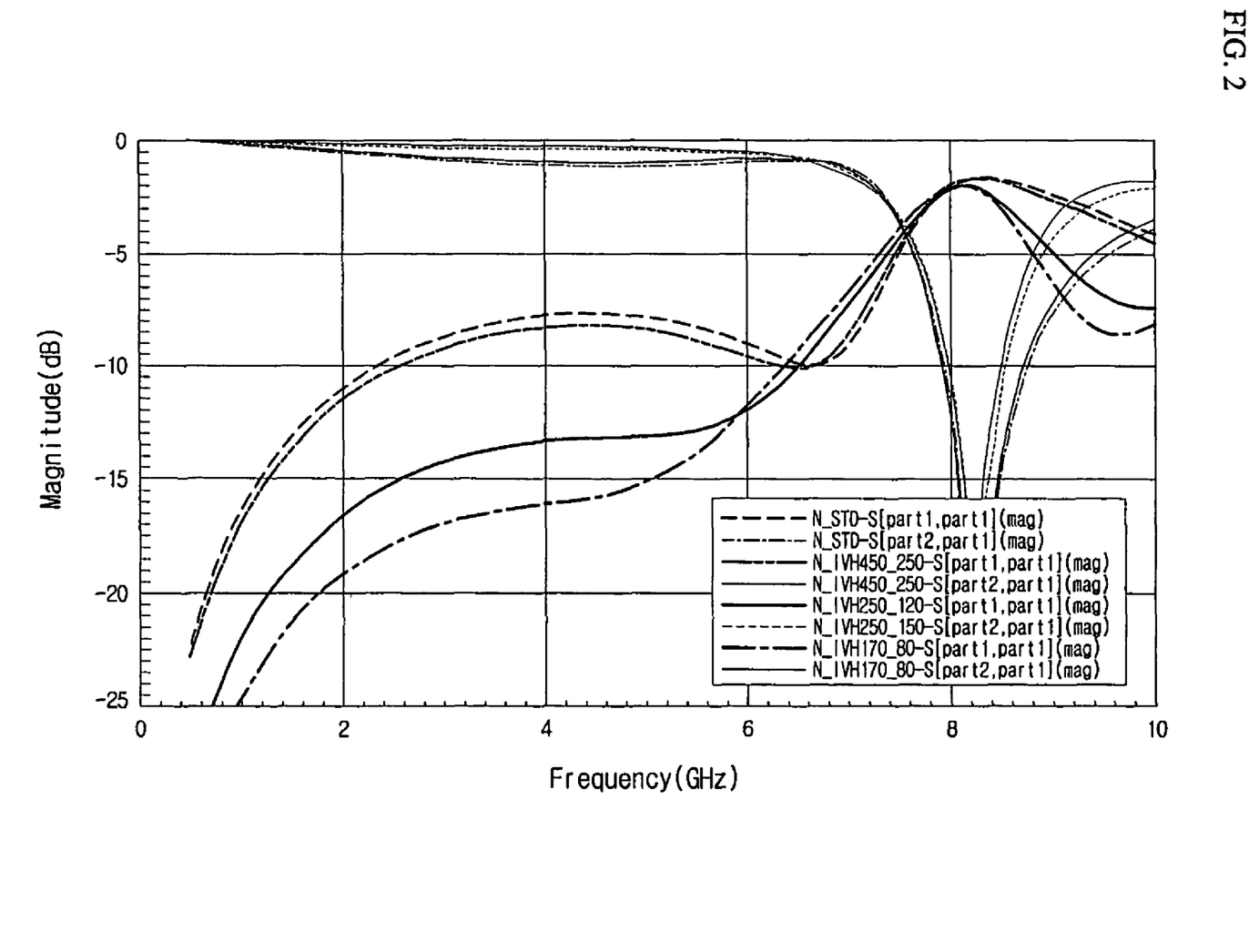
FIG. 2 shows a graph illustrating the noise corresponding to the diameter of an IVH formed on the semiconductor package substrate.

FIG. 2 is a graph illustrating the noise corresponding to the diameter of an IVH formed on the semiconductor package substrate. Referring to FIG. 2, the x-axis indicates the frequency of the signal (unit: GHz) while the y-axis indicates the noise (unit: dB).

In the frequency band of a general signal, which is 0~6 GHz, the smaller the radius of the IVH is, the smaller the noise becomes. Thus, the diameter of the IVH must be reduced in order to improve the signal delivery characteristic of the package substrate. With a thick CCL core, however, forming a small-diameter IVH is technically very difficult. Since the IVH is formed using a CNC drill, the diameter of which is about 100 μm~350 μm, there is limitation to how much the diameter can be reduced. Although reducing the diameter is possible, the process is very costly.

SUMMARY OF THE INVENTION

The present invention provides a coreless substrate, and a manufacturing method thereof, whose signal delivery characteristic is improved by eliminating the IVH.

The present invention also provides a coreless substrate, and a manufacturing method thereof, in which the IVH becomes thin by eliminating the core layer.

In addition, the present invention provides a coreless substrate, and a manufacturing method thereof, which can perform various functions through a single process because various function pads can be formed using a metal sheet.

Other technical objects of the present invention shall be easily understood through the following description.

An aspect of the present invention can feature a method for manufacturing a coreless substrate. The method comprises: (a) forming an insulating layer on one side of a metal sheet; (b) forming a via hole on the insulating layer for electrical connection between the metal sheet and the other side; and (c) forming a plurality of protruded function pads by etching the metal sheet.

The method can further comprise: (d) coupling the metal sheet to another metal sheet by use of an adhesive; and (e) separating the metal sheet from the adhesive. The step (d) can precede the step (a), and the step (e) can follow the step (c).

The adhesive can be adhered to the border of the two metal sheets, and the metal sheets can be separated from the adhesive by cutting off the border of the metal sheets in the step (e).

In the step (b), a circuit having a pattern can be formed on the insulating layer, and the via hole can electrically connect the circuit and the metal sheet.

The method can further comprise the step of (f) forming a solder resist on the insulating layer to protect the surface of the substrate.

The method can further comprise the step of (g) treating the surface on the function pads, using a metal.

The metal for surface treatment can be Ni or Au.

The function pads can comprise a stiffener.

The function pads can comprise a solder ball pad.

The function pads can comprise a thermal pad.

Another aspect of the present invention can feature a coreless substrate comprising: a plurality of function pads, etched from a metal sheet and having a protruded shape; an insulating layer, the insulating layer being formed on one side of the function pads, a circuit corresponding to a pattern being formed on the insulating layer, a via hole being formed on the insulating layer to electrically connect the function pads and the circuit; and a solder resist, being formed on the insulating layer to protect the surface of the insulating layer.

A circuit having a pattern can be formed on the insulating layer, and the via hole can electrically connect the circuit and the function pads.

The coreless substrate can further comprise a metal, which is surface-treated on the function pads.

The surface-treating metal can be Ni or Au.

The function pads can comprise a stiffener.

The function pads can comprise a solder ball pad.

The function pads can comprise a thermal pad.

BRIEF DESCRIPTION OF THE DRAWINGS

These and other features, aspects, and advantages of the present invention will become better understood with regard to the following description, appended claims, and accompanying drawings where:

FIG. 3A-E shows the process of manufacturing a coreless semiconductor package substrate in accordance with a preferred embodiment of the present invention;

DETAILED DESCRIPTION OF THE PREFERRED EMBODIMENTS

Hereinafter, a preferred embodiment of the coreless substrate and the manufacturing method thereof in accordance with the present invention will be described in detail with reference to the accompanying drawings. In referencing the accompanying drawings, identical elements are given the same reference numerals, regardless of their figure numbers, and any redundant description thereof will be omitted. The substrate described hereinafter includes any substrate for delivering an electrical signal. For example, the substrate in accordance with the present invention can comprise a rigid substrate, a flex substrate, an LTCC substrate, a single-side/multi-side/multilayer substrate and a substrate for packing a semiconductor (e.g. BGA, FBGA and TBGA). Hereinafter, a semiconductor package substrate for bonding a flip chip will be described.

Generally, in order to reduce the diameter of an IVH, it is necessary to use a thinner CCL core. However, reducing the thickness of the CCL core while maintaining the present flip chip substrate structure causes warpage. Therefore, the present invention provides a package substrate structure that does not cause warpage regardless of the diameter of the IVH by realizing a structure without the CCL core, unlike the conventional package substrate structure. For this, the present invention utilizes an etched dummy metal plate, which can carry out both the role of stiffener and the role of enhancing the solder joint strength.

Figure 3:
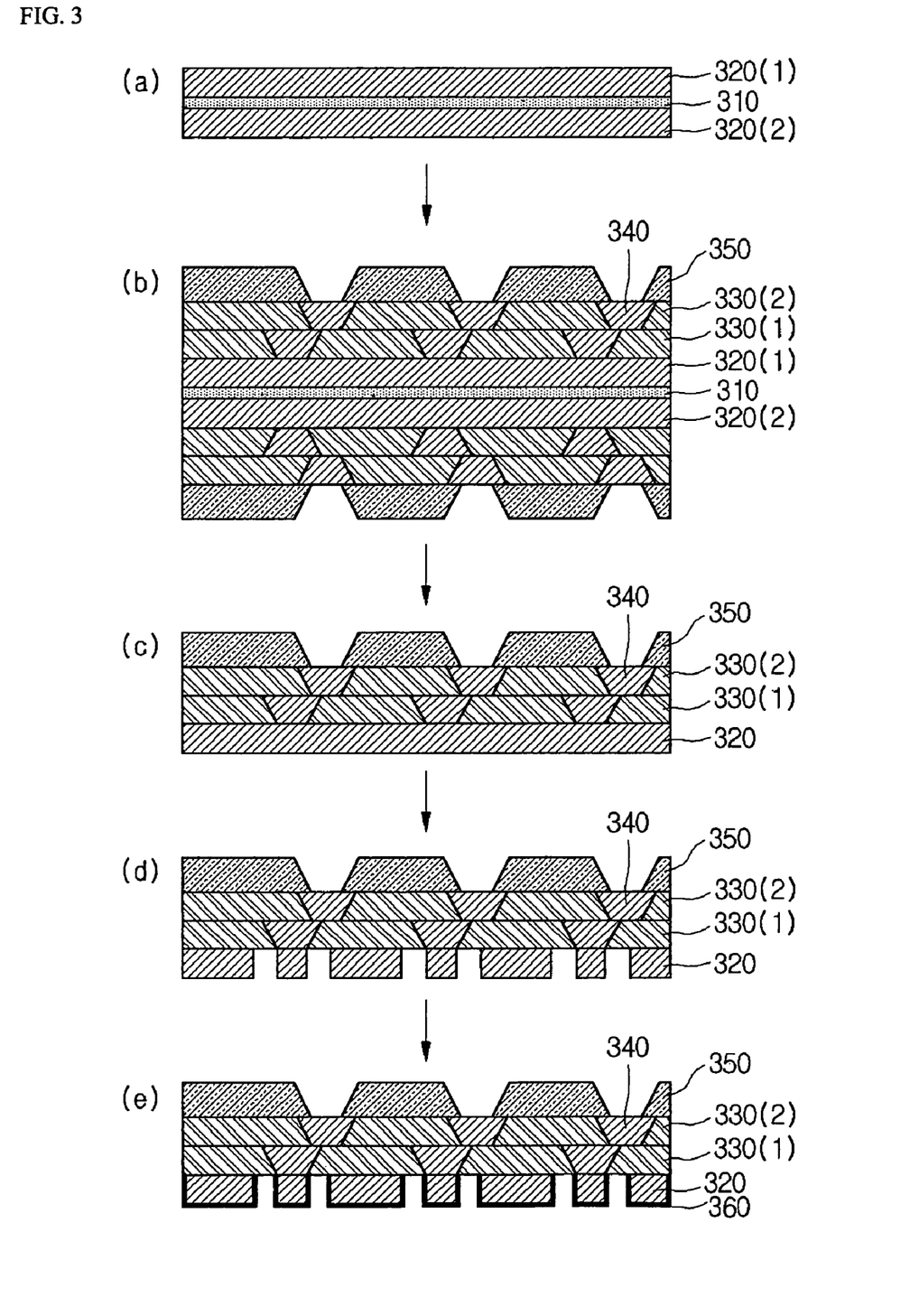

FIG. 3 is a diagram illustrating the process of manufacturing a coreless semiconductor package substrate in accordance with a preferred embodiment of the present invention. It is possible to use both one metal sheet and two metal sheets to form an insulating layer and a circuit on one side of the metal sheet. In the description below, the insulating layer and the circuit are formed on two sides of the metal sheets 320(1) and 320(2) that are coupled using the adhesive 310.

Referring to step (a), two metal sheets 320(1) and 320(2) are adhered to both sides of the adhesive 310. The thickness of the metal sheet can be about 0.1~0.2 mm, and can be determined according to the role of the function pad, which will be formed later.

In the process of manufacturing a multilayer printed circuit board, the circuit (i.e. inner layer circuit or outer layer circuit) is formed through the additive method, subtractive method or semi-additive method.

In the additive method, the circuit is formed on a printed circuit board by selectively depositing a conductive material on an insulating substrate through electroless plating or electrolytic plating to plate the conductive material on the insulating substrate and form a conductive pattern. The additive method is classified as the full-additive method and the semi-additive method, depending on the presence of a seed layer for electrolytic copper plating.

In the subtractive method, the circuit is formed on a printed circuit board by selectively etching off unnecessary portions other than the conductive material from the metal-coated insulating substrate. It is also called the "tent and etch" method because the area in which the conductive pattern is to be formed through photo resist and the inside of the hole are tented and etched. Although the semi-additive method is described hereinafter, it shall be evident that the present invention is by no means restricted to the semi-additive method.

Referring to step (b), two metal sheets 320(1) and 320(2) are formed on both sides of the adhesive 310, and insulating layers 330(1) and 330(2) are stacked on one metal sheet 320(1). At least one blind via hole (BVH) is formed on each of the insulating layers 330(1) and 330(2) for electrical connection between the layers. The via holes on the insulating layers 330(1) and 330(2) can be formed by use of a $CO_2$ laser or Yag laser, and therefore are smaller than the inner via holes described earlier. Then, the texturing and electroless copper plating can be performed. In addition, a solder resist 350 is formed in the upper part of the insulating layer 330(2) in order to protect the surface of the substrate or insulating layer 330(2). In other words, after testing the outer layer and measuring the scale, the solder resist 350 exposure film is designed and manufactured. Then, the solder resist 350 is pre-processed, that is, the surface of the copper foil is made rough by brush-grinding such that the solder resist 350 ink is better adhered to the substrate. Then, the solder resist 350 is coated; the solder resist 350 is exposed using the solder resist 350 exposure film adaptively designed in the previous step; the solder resist 350 ink is removed through a developing process; and a number of post-processes, including surface treatment and electric/final test, are carried out. Although a plurality of insulating layers 330(1) and 330(2) are described, a single insulating layer can be used in the present invention.

Referring to step (c), the metal sheets 320(1) and 320(2) are separated from the adhesive 310. The adhesive 310, therefore, may be made from elements that are easily adhered to and separated from the metal sheets 320(1) and 320(2). For this reason, the adhesive 310 may be a thermal release tape, which can be separated by heat. The coating process of solder resist 350, described above, can be performed either before or after separating the metal sheets 320(1) and 320(2).

Referring to step (d), a variety of function pads are formed by etching the metal sheet 320 in accordance with a predetermined pattern. The function pad can be a variety of pads, including a stiffener, solder ball pad and thermal release pad.

Referring to step (e), the surface can be treated using the metal surrounding the variety of function pads formed by etching the metal sheet 320. The surface treatment metal can be Ni and Au, and can be plated through an electrolytic plating process. For the package substrate for bonding a flip chip, a bumping process can be added later.

Here, the following general method of manufacturing a substrate can be added: An inner-layer base material that meets the product specification is cut, and a predetermined internal circuit pattern is formed using a dry film and a working film. Here, the inner layer can be scrubbed, an inner layer dry film can be laminated, and the inner layer can be exposed/developed. Then, prior to bonding the inner layer, on which the circuit pattern is formed, to the outer layer, a brown (black) oxide process is carried out in order to strengthen the adhesion. That is, the surface of a copper foil is chemically oxidized to enhance the surface roughness such that the lamination results in better adhesion. Then, by laminating the inner-layer substrate and a prepreg, prelamination and lamination processes are carried out. Then, the laminated inner layer substrate and the prepreg are vacuum pressed. It is possible that the laminated inner layer substrate and the prepreg are hot pressed or cool pressed, instead of being vacuum pressed. The resin and copper foil are trimmed from the corners of the panel, and an X-ray target drilling process, in which a hole is made at a target guide mark on the inner layer circuit, is carried out in preparation of a drilling process. Then, the drilling process is carried out for electric conduction between the layers of the substrate. Here, a computer numerical control (CNC) method can be used for the drilling process. Then, the outer layer is coated with the dry film and the working film in order to form a circuit pattern, exposed to a light of a predetermined intensity for a predetermined duration, and the unirradiated areas are developed in an etching process.

The general manufacturing process of a flipchip BGA package is as follows: (a) An aluminum pad is formed on a semiconductor chip and is covered with a protective layer. (b) Through a sputtering process, a metal layer is formed and is connected to the pad. (c) A photo resist is laminated such that only the pad area is open. (d) The pad area, in which the photo resist is open, is lead-plated. (e) The covered photo resist is removed. (f) The metal film outside the lead-plated area is etched off. (g) The plated lead is heated to be made round. (h) A bump chip made through the above steps is spliced to a flipchip BGA substrate. To splice the contact pad of the bump chip with the contact pad of the flipchip BGA substrate, the substrate is heated to a high temperature in a reflow device to melt the lead. Then through an underfill process, resin is filled between the flipchip BGA substrate and the chip.

Figure 4:
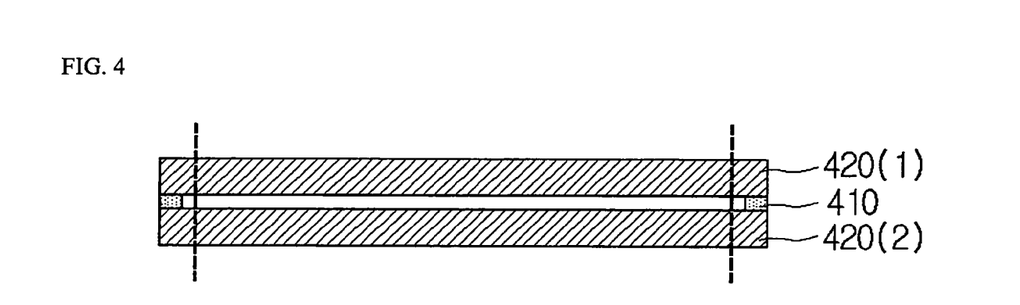
FIG. 4 shows a diagram of an adhesive used in the manufacturing of a coreless semiconductor package substrate in accordance with another preferred embodiment of the present invention.

FIG. 4 shows a diagram of an adhesive used in the manufacturing of a coreless semiconductor package substrate in accordance with another preferred embodiment of the present invention. Referring to FIG. 4, the sectional view, which can replace FIG. 3(a), shows an adhesive 410 and metal sheets 420(1) and 420(2).

The adhesive is applied on the border of the two metal sheets 420(1) and 420(2), and by cutting off the border, the metal sheets 420(1) and 420(2) can be separated from the adhesive 410. The adhesive may be applied to a portion or the entire area of the border of the metal sheets 420(1) and 420(2). If the adhesive 410 is applied to a portion of the border of the metal sheets 420(1) and 420(2), it becomes easy to separate the metal sheets 420(1) and 420(2) from the adhesive 410. If the adhesive 410 is applied to the entire area of the border of the metal sheets 420(1) and 420(2), the metal sheets 420(1) and 420(2) are better adhered to the adhesive 410. Moreover, since the adhesive 410 is applied only to the border of the metal sheets 420(1) and 420(2), the metal sheets 420(1) and 420(2) can be separated from the adhesive 410 by cutting off the border of the metal sheets 420(1) and 420(2). This provides a wider range of selection of the adhesive. Since the adhesive does not need to be separated from the metal sheets, for example, an adhesive that is not easily separated from the metal sheets can be used. For this kind of tape, which is not easily separated by heat (i.e. not a thermal release tape), a general adhesive tape, a paste-type adhesive, a plating-layer-using adhesive or other varieties can be used.

So far, the manufacturing process generally illustrating a coreless substrate and a manufacturing method thereof has been described. Hereinafter, particular embodiments of the coreless substrate and manufacturing method thereof in accordance with the present invention will be described with reference to the accompanying drawings. Four major embodiments, depending on the uses of the function pad, will be described.

Figure 5:
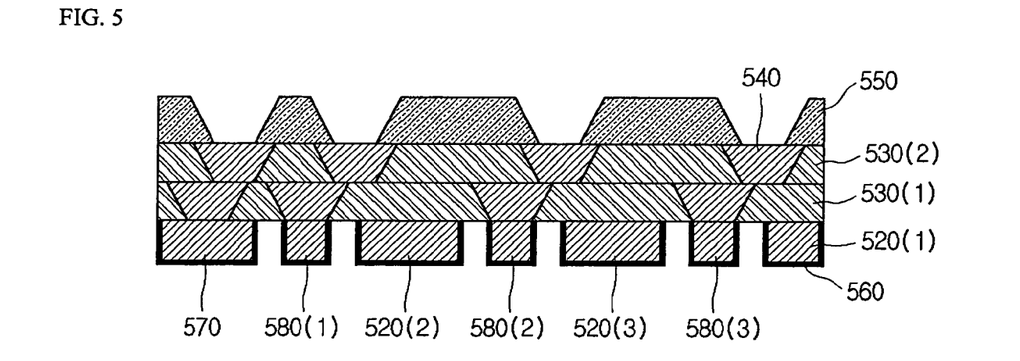
FIG. 5 shows the sectional view of a coreless semiconductor package substrate in accordance with a first preferred embodiment of the present invention.

FIG. 5 is a sectional view of a coreless semiconductor package substrate with a variety of function pads in accordance with a first preferred embodiment of the present invention. Referring to FIG. 5, the semiconductor package comprises stiffener metals 520(1), 520(2) and 520(3), insulating layers 530(1) and 530(2), a via hole, a solder resist 550, a surface-treating metal 560, a thermal pad 570 and solder ball pads 580(1), 580(2) and 580(3). The function pads can include the stiffener metals 520(1), 520(2) and 520(3), the thermal pad 570 and the solder ball pads 580(1), 580(2) and 580(3).

To form the function pads, i.e. the stiffener metals 520(1), 520(2) and 520(3), the thermal release pad 570 and the solder ball pads 580(1), 580(2) and 580(3), the metal dummy plate formed on the bottom of the substrate is exposed, developed and etched, and the dry film is peeled off. Here, several varieties of function pads can be formed simultaneously through a series of processes.

The stiffener metals 520(1), 520(2) and 520(3) prevent the package substrate from warping. The thermal pad 570 can effectively release and remove the heat generated from the semiconductor chip. Function pads having solder ball pads 580(1), 580(2) and 580(3) can have higher solder joint strength, owing to the non-solder mask fined structure. Since the present invention mounts the stiffener metals 520(1), 520(2) and 520(3) on the opposite side of where the semiconductor chip is mounted, it is easier to mount a decoupling capacitor.

Figure 6:
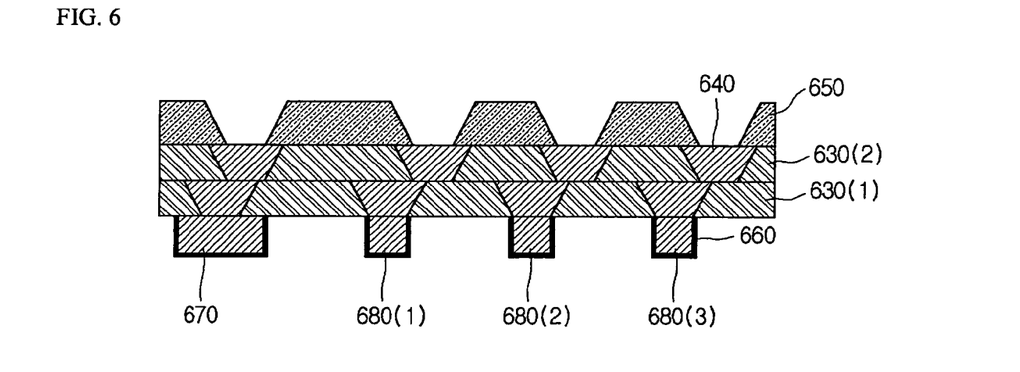
FIG. 6 shows the sectional view of a coreless semiconductor package substrate in accordance with a second preferred embodiment of the present invention.

FIG. 6 is a sectional view of a semiconductor package substrate without a core and stiffeners in accordance with a second preferred embodiment of the present invention. Referring to FIG. 6, the semiconductor package comprises insulating layers 630(1) and 630(2), a via hole 640, a solder resist 650, a surface-treating metal 660, thermal pad 670 and solder ball pad 680(1), 680(2) and 680(3). The function pads can include the thermal pad 670 and the solder ball pads 680(1), 680(2) and 680(3). Hereinafter, the difference from the first preferred embodiment will be described.

Comparing with the first preferred embodiment, the function pads formed on the semiconductor package substrate of the second preferred embodiment does not have the stiffener metals 520(1), 520(2) and 520(3). That is, by eliminating the stiffener metals 520(1), 520(2) and 520(3) from the etching process, the second preferred embodiment can achieve a fine pitch on the function pads. Thus, the function pads of the second preferred embodiment comprises only the thermal pad 670 and the solder ball pads 580(1), 580(2) and 580(3). Here, if necessary, the thermal pad 670 may be also eliminated from the etching process.

Figure 7:
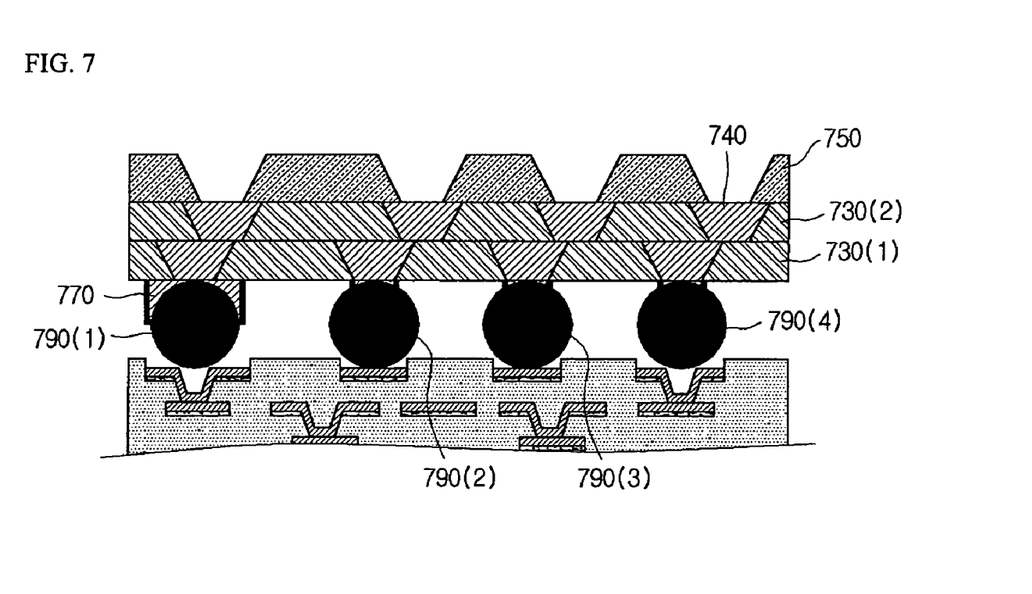
FIG. 7 shows the sectional view of a coreless semiconductor package substrate in accordance with a third preferred embodiment of the present invention.

FIG. 7 is a sectional view of a soldered coreless semiconductor package substrate in accordance with a third preferred embodiment of the present invention. Referring to FIG. 7, the semiconductor package comprises insulating layers 730(1) and 730(2), a via hole 740, a solder resist 750, a function pad 770 and solder balls 790(1), 790(2) and 790(3).

The case of the function pad 770 being coupled to the mother board by soldering is illustrated here. According to the prior art, the electrode pad being soldered is located between solder resists, and thus the bonding is hardly stable. The present invention, however, performs the soldering by use of a protruded function pad 770, making the bonding very stable.

Figure 8:
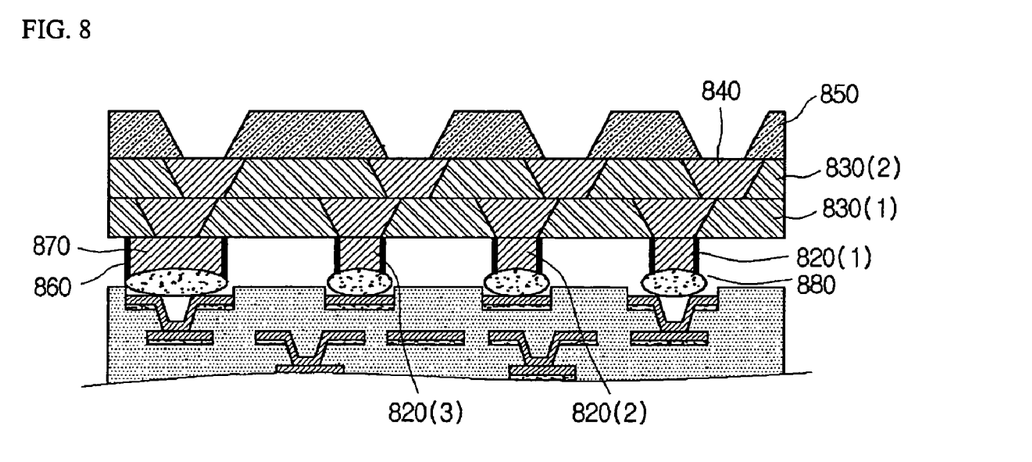
FIG. 8 shows the sectional view of a coreless semiconductor package substrate in accordance with a fourth preferred embodiment of the present invention.

FIG. 8 is a sectional view of a coreless semiconductor package substrate coupled to a mother board by a paste in accordance with a fourth preferred embodiment of the present invention. Referring to FIG. 8, the semiconductor package comprises insulating layers 830(1) and 830(2), a via hole 840, a solder resist 850, function pads 820(1), 820(2), 820(3) and 870 and a conductive paste 880.

The case of the semiconductor package being coupled to the substrate by use of the conductive paste 880 is illustrated here. By using the protruded function pads 820(1), 820(2), 820(3) and 870 formed on the semiconductor package, the semiconductor can be securely coupled to the substrate. The conductive paste 880 can be an anisotropic conductive paste.

As described above, the coreless substrate and manufacturing method thereof in accordance with the present invention have the signal delivery characteristic that is improved by eliminating the IVH.

The coreless substrate and manufacturing method thereof in accordance with the present invention can make the IVH thin by eliminating the core layer.

In addition, the coreless substrate and manufacturing method thereof in accordance with the present invention can perform various functions through a single process because various function pads can be formed using a metal sheet.

Although certain preferred embodiments of the present invention have been described, anyone of ordinary skill in the art to which the invention pertains should be able to understand that a large number of modifications and permutations are possible within the spirit and scope of the invention and its equivalents, which shall only be defined by the claims, appended below.

The invention claimed is:

1. A coreless substrate comprising:
   an insulating layer having a circuit formed on an upper surface of the insulating layer, the insulating layer being penetrated by a via hole;
   a plurality of function pads etched from a metal sheet and electrically connected to the circuit through the via hole, the metal sheet being stacked under the insulating layer and each of the function pads having a downwardly protruded shape; and
   a solder resist, formed on the upper surface of the insulating layer.

2. The coreless substrate of claim 1, further comprising a metal, the metal being surface-treated on the function pads.

3. The coreless substrate of claim 2, wherein the metal is Ni or Au.

4. The coreless substrate of claim 1, wherein the function pads comprise a stiffener to prevent a warping of the substrate.

5. The coreless substrate of claim 1, wherein the function pads comprise a solder ball pad.

6. The coreless substrate of claim 1, wherein the function pads comprise a thermal pad.

* * * * *